US006867616B1

(12) United States Patent
Venkata et al.

(10) Patent No.: US 6,867,616 B1
(45) Date of Patent: Mar. 15, 2005

(54) PROGRAMMABLE LOGIC DEVICE SERIAL INTERFACE HAVING DUAL-USE PHASE-LOCKED LOOP CIRCUITRY

(75) Inventors: Ramanand Venkata, San Jose, CA (US); Chong H. Lee, San Ramon, CA (US); Rakesh Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 89 days.

(21) Appl. No.: 10/455,773

(22) Filed: Jun. 4, 2003

(51) Int. Cl.[7] .................. H03K 19/173; H03D 3/24
(52) U.S. Cl. .................. 326/41; 326/47; 375/376
(58) Field of Search .................. 326/39, 41, 47; 375/215, 294, 373, 327, 376

(56) References Cited

U.S. PATENT DOCUMENTS

| 3,218,876 A | * 11/1965 | Berger | 476/9 |
| 4,494,021 A | 1/1985 | Bell et al. | 307/591 |

(List continued on next page.)

FOREIGN PATENT DOCUMENTS

| EP | 0 266 065 | 9/1987 |
| EP | 0-416-930 | 3/1991 |
| EP | 0-778-517 | 6/1997 |
| JP | 1-137646 | 5/1989 |

OTHER PUBLICATIONS

Advanced Micro Devices, Inc., "Am2971 Programmable Event Generator (PEG)," Publication No. 05280, Rev. C, Amendment/0, pp. 4–286–4–303 (Jul. 1986).

Advanced Micro Devices, Inc., "AmPAL*23S8 20–Pin IMOX PAL–Based Sequencer," Publication No. 06207, Rev. B, Amendment/0, pp. 4–102–4–121 (Oct. 1986).

DynaChip Corp., "Application Note: Using Phase Locked Loops in DL6035 Devices" (1998).

DynaChip Corp., DY6000 Family Datasheet (Dec. 1998).

Ko, U., et al., "A 30–ps Jitter, 3.6 $\mu$s Locking, 3.3–Volt Digital PLL for CMOS Gate Arrays," *Proceedings of the IEEE 1993 Custom Integrated Circuits Conference*, Publication No. 0–7803–0826–3/93, pp. 23.31–23.3.4 (May 9–12, 1993).

LSI Logic Corp., 500K Technology Design Manual (Document DB04–000062–00, First Edition), pp. 8–1–8–33 (Dec. 1996).

Lucent Technologies, Inc., Optimized Reconfigurable Cell Array (ORCA®) OR3Cxxx/OR3Txxx Series Field–Programmable Gate Arrays, Preliminary Product Brief, (Nov. 1997).

Lucent Technologies, Inc., ORCA® Series 3 Field–Programmable Gate Arrays, Preliminary Data Sheet, Rev. 01 (Aug. 1998).

(List continued on next page.)

*Primary Examiner*—Daniel D. Chang
(74) *Attorney, Agent, or Firm*—Fish & Neave IP Group of Ropes & Gray LLP; Jeffrey H. Ingerman

(57) ABSTRACT

In a programmable logic device ("PLD"), a serial interface incorporating phase-locked loops ("PLLs") is provided with connections that allow one or more of the PLLs to be used as general purpose PLLs in the PLD. The connections include conductors to allow reference clock signals from the PLD logic core, or from outside the PLL, to be used by the PLLS, as well as conductors that allow the PLD core to control the phases of the PLLs. For some of the PLLs, conductors to allow the PLL output clock to be used by the PLD are also provided, where such output conductors do not normally exist in such a serial interface.

33 Claims, 4 Drawing Sheets

U.S. PATENT DOCUMENTS

| | | | |
|---|---|---|---|
| 4,633,488 A | 12/1986 | Shaw | 375/120 |
| 4,719,593 A | 1/1988 | Threewitt et al. | 364/900 |
| 4,868,522 A | 9/1989 | Popat et al. | 331/2 |
| 4,959,646 A | 9/1990 | Podkowa et al. | 340/825.83 |
| 5,072,195 A | 12/1991 | Graham et al. | 331/2 |
| 5,075,575 A | 12/1991 | Shizukuishi et al. | 307/465 |
| 5,079,519 A | 1/1992 | Ashby et al. | 331/1 A |
| 5,133,064 A | 7/1992 | Hotta et al. | 395/550 |
| 5,204,555 A | 4/1993 | Graham et al. | 307/465 |
| 5,239,213 A | 8/1993 | Norman et al. | 307/465 |
| 5,349,544 A | 9/1994 | Wright et al. | 364/600 |
| 5,394,116 A | 2/1995 | Kasturia | 331/34 |
| 5,397,943 A | 3/1995 | West et al. | 326/39 |
| 5,418,499 A | 5/1995 | Nakao | 331/57 |
| 5,420,544 A | 5/1995 | Ishibashi | 331/11 |
| 5,424,687 A | 6/1995 | Fukuda | 331/11 |
| 5,448,191 A | 9/1995 | Meyer | 327/105 |
| 5,506,878 A | 4/1996 | Chiang | 377/39 |
| 5,542,083 A | 7/1996 | Hotta et al. | 395/550 |
| 5,581,214 A | 12/1996 | Iga | 327/107 |
| 5,629,651 A | 5/1997 | Mizuno | 331/34 |
| 5,642,082 A | 6/1997 | Jefferson | 331/25 |
| 5,646,564 A | 7/1997 | Erickson et al. | 327/158 |
| 5,656,959 A | 8/1997 | Chang et al. | 327/105 |
| 5,699,020 A | 12/1997 | Jefferson | 331/17 |
| 5,742,180 A | 4/1998 | DeHon et al. | 326/40 |
| 5,744,991 A | 4/1998 | Jefferson et al. | 327/158 |
| RE35,797 E | 5/1998 | Graham et al. | 326/40 |
| 5,777,360 A | 7/1998 | Rostoker et al. | 257/315 |
| 5,815,016 A | 9/1998 | Erickson | 327/158 |
| 5,847,617 A | 12/1998 | Reddy et al. | 331/57 |
| 5,889,436 A | 3/1999 | Yeung et al. | 331/2 |
| 5,900,757 A | 5/1999 | Affarwal et al. | 327/198 |
| 5,963,069 A | 10/1999 | Jefferson et al. | 327/158 |
| 5,970,110 A | 10/1999 | Li | 377/48 |
| 5,974,105 A | 10/1999 | Wang et al. | 375/376 |
| 5,987,543 A | 11/1999 | Smith | 710/70 |
| 5,999,025 A | 12/1999 | New | 327/156 |
| 6,014,048 A | 1/2000 | Talaga, Jr. et al. | 327/156 |
| 6,043,677 A | 3/2000 | Albu et al. | 326/39 |
| 6,069,506 A | 5/2000 | Miller, Jr. et al. | 327/156 |
| 6,069,507 A | 5/2000 | Shen et al. | 327/156 |
| 6,104,222 A | 8/2000 | Embree | 327/156 |
| 6,114,915 A | 9/2000 | Huang et al. | 331/1 A |
| 6,141,394 A | 10/2000 | Linebarger et al. | 375/376 |
| 6,249,189 B1 | 6/2001 | Wu et al. | 331/18 |
| 6,252,419 B1 | 6/2001 | Sung et al. | 326/38 |
| 6,278,332 B1 | 8/2001 | Nelson et al. | 331/17 |
| 6,320,469 B1 | 11/2001 | Friedberg et al. | 331/1 A |
| 6,373,278 B1 | 4/2002 | Sung et al. | 326/38 |
| 6,388,478 B1 * | 5/2002 | Mann | 327/113 |
| 6,483,886 B1 | 11/2002 | Sung et al. | 375/376 |

OTHER PUBLICATIONS

Monolithic Memories, Inc., "Programmable Array Logic PAL20RA10–20 Advance Information," pp. 5–95–5–102 (Jan. 1988).

National Semiconductor Corp., *LVDS Owner's Manual & Design Guide* (Apr. 25, 1997).

Xilinx, Inc., Virtex 2.5V Field Programmable Gate Arrays Advance Product Specification (Version 1.0) (Oct. 20, 1998).

Xilinx, Inc., Application Note: Using the Virtex Delay–Locked Loop (Version 1.31) (Oct. 21, 1998).

Zaks, R., Et al., *From Chips to Systems: An Introdction to Microcomputers*, pp. 54–61 (Prentice–Hall, Inc., Englewood Cliffs, N.J., 1987).

* cited by examiner

PROGRAMMABLE LOGIC DEVICE SERIAL INTERFACE HAVING DUAL-USE PHASE-LOCKED LOOP CIRCUITRY

BACKGROUND OF THE INVENTION

This invention relates to phase-locked loop circuitry provided in one portion of a programmable logic device, where the phase-locked loop circuitry can be used in another portion of the programmable logic device.

It is known to incorporate phase-locked loop ("PLL") circuitry on programmable logic devices ("PLDs"). For example, it has become common for PLDs to accommodate various input/output ("I/O") standards, some of which require very accurate high-speed clocks. One way of providing such clocks is to provide PLL circuitry on the PLD.

For example, recently PLDs have begun to incorporate high-speed serial interfaces to accommodate high-speed (i.e., greater than 1 Gbps) high-speed serial I/O standards—e.g., the XAUI (10 Gbps Extended Attachment Unit Interface) standard. In accordance with the XAUI standard, a high-speed serial interface includes transceiver groups known as "quads," each of which includes four transceivers and some central logic. Within each transceiver, the receiver portion typically includes a PLL, primarily for the purpose of enabling clock data recovery from a received high-speed serial signal. In addition, the central logic typically includes a PLL, primarily for the purpose of generating a transmit clock to be used by the transmitter portion of each of the four transceivers. Thus, a quad typically includes five PLLs.

PLLs are relatively large and complex circuits, and providing PLLs on PLDs therefore either adds significant area to the PLD, or takes away area that could be used for programmable logic circuitry in a PLD of a given size. Because PLDs are, by definition, programmable by their users, in any particular user logic design for a PLD including a high-speed serial interface as described above, there is a significant probability that some or all of the PLLs included in that interface may not be used in the user logic design. As far as that user design is concerned, the PLL circuitry is simply wasted. It would be desirable to be able to recapture that circuitry when it is not being used as part of the high-speed serial interface.

SUMMARY OF THE INVENTION

The present invention provides high-speed serial interface circuitry on a programmable logic device that is more flexible than previously known high-speed serial interfaces in that the PLL circuits within the high-speed serial interface can be recaptured when the interface is not being used, or is being only partially used. This is accomplished by providing each PLL in the interface with a first connection that accepts a phase control input from elsewhere on the programmable logic device and a second connection that accepts a reference clock signal either from outside the programmable logic device or from elsewhere on the programmable logic device, instead of from the input serial data for which the serial interface is designed.

An interface of the this type typically has four channels, in compliance with the XAUI standard. Thus, the interface ordinarily would have four transmitter/receiver pairs. Each receiver in those pairs preferably includes a PLL for use in clock data recovery ("CDR"). The output of the PLL normally is used only for CDR purposes, and normally is not available outside the interface. To facilitate reuse of any such PLL when that channel is not in use, there is preferably provided in accordance with the present invention a connection that makes the PLL output available to the PLD core even where such connections normally are not provided.

The phase control input is common in PLL circuits, but has not heretofore been provided for PLLs in serial interfaces of the type described above, because such PLLs generally are phase-locked to the data being processed, and as such phase adjustments are not necessary. However, if the PLL is to be used as a general-purpose PLL available to the programmable logic core of the PLD, it is desirable for the core to be able to adjust the phase of the PLL.

Similarly, the only reference clock input normally required by a PLL in the interface is that derived by the interface from the input serial data using clock data recovery techniques. However, if the PLL is to be used as a general-purpose PLL available to the programmable logic core, it is desirable for the core to be able to provide the reference clock to be used by the PLL, or for such a clock to be provided externally by a user.

In addition, the interface typically includes control logic that includes, among other things, a PLL that provides a reference clock for each of the transmitters in the interface. Thus a fifth PLL is available for potential reuse (assuming the interface is not in use at all, or is being used only for receiving). Whereas the output of the fifth PLL normally is available only to the transmitters, in accordance with the present invention a lead is provided making the fifth PLL output available to the programmable logic core.

It should be noted that PLL outputs made available in accordance with this invention preferably may be connected to any clock trees available on the PLD for distribution throughout the PLD with minimum skew.

Similarly, ordinarily the receiver PLLs receive their reference clock from the input data, while the central logic PLL ordinarily receives its reference clock from either the programmable logic core or off-chip inputs. In accordance with the present invention, each PLL can select its reference clock from either its ordinary source or from a reference clock supplied by the programmable logic core. For example, a multiplexer may be provided that allows a receiver PLL to select as its reference clock either the input data or the core reference clock. A multiplexer also may be provided that allows the central logic PLL to select as its reference clock either an external clock that is provided, or the core reference clock.

It should be noted that while the invention has so far been described with respect to an interface compliant with the XAUI standard, which therefore has four channels, this invention is applicable to serial interfaces with any number of channels, and more particularly with making any PLLs in such an interface available if not being used for its ordinary purpose for which it is provided in the interface.

Moreover, although the discussion so far has focused on the multiple PLLs of a single serial interface, a PLD may have several such interfaces and it may be desirable to use the PLLs in more than one interface. If so, it would be preferable for the PLLs in more than one interface to receive the same reference clock signal, and preferably with minimum skew. Therefore, in accordance with this invention there is also preferably provided a multiple interface reference clock distribution network. Such a distribution network preferably includes at least one conductor spanning several interfaces, with each interface, or alternatively each of the PLLs in those several interfaces, being able to be programmably connected to that conductor. More than one conductor may be provided if different groups of PLLs are to be clocked with different reference clocks. And any such conductor or conductors may preferably be arranged as a balanced clock tree or trees to minimize skew in the delivery of the reference clock signals.

Thus, in accordance with the present invention, there is provided a serial interface for use in a programmable logic device. The serial interface includes at least one phase-locked loop circuit for use in processing serial data. The serial interface further includes a first connection for accepting from elsewhere in the programmable logic device a phase control signal for input into at least one of the at least one phase-locked loop circuit, a second connection for accepting from at least one of (a) elsewhere in the programmable logic device, and (b) outside the programmable logic device, a reference clock for input into the at least one of the at least one phase-locked loop circuit. A programmable logic device incorporating such an interface is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention improves resource utilization in PLDs having PLLs incorporated thereon, by allowing portions of unused PLLs to be used for other functions by the programmable logic core of the PLD. This preferably is accomplished by providing phase control inputs for the PLLs from the programmable logic core and additional connections that allow PLL outputs that normally remain within an I/O interface to be used outside that I/O interface in the programmable logic core of the PLD. Additional connections preferably are provided that allow signals, particularly reference clocks, from the programmable logic core to be input to the I/O interface, preferably with minimal if any skew.

The invention will now be described with reference to FIGS. 1–4.

Figure 1:
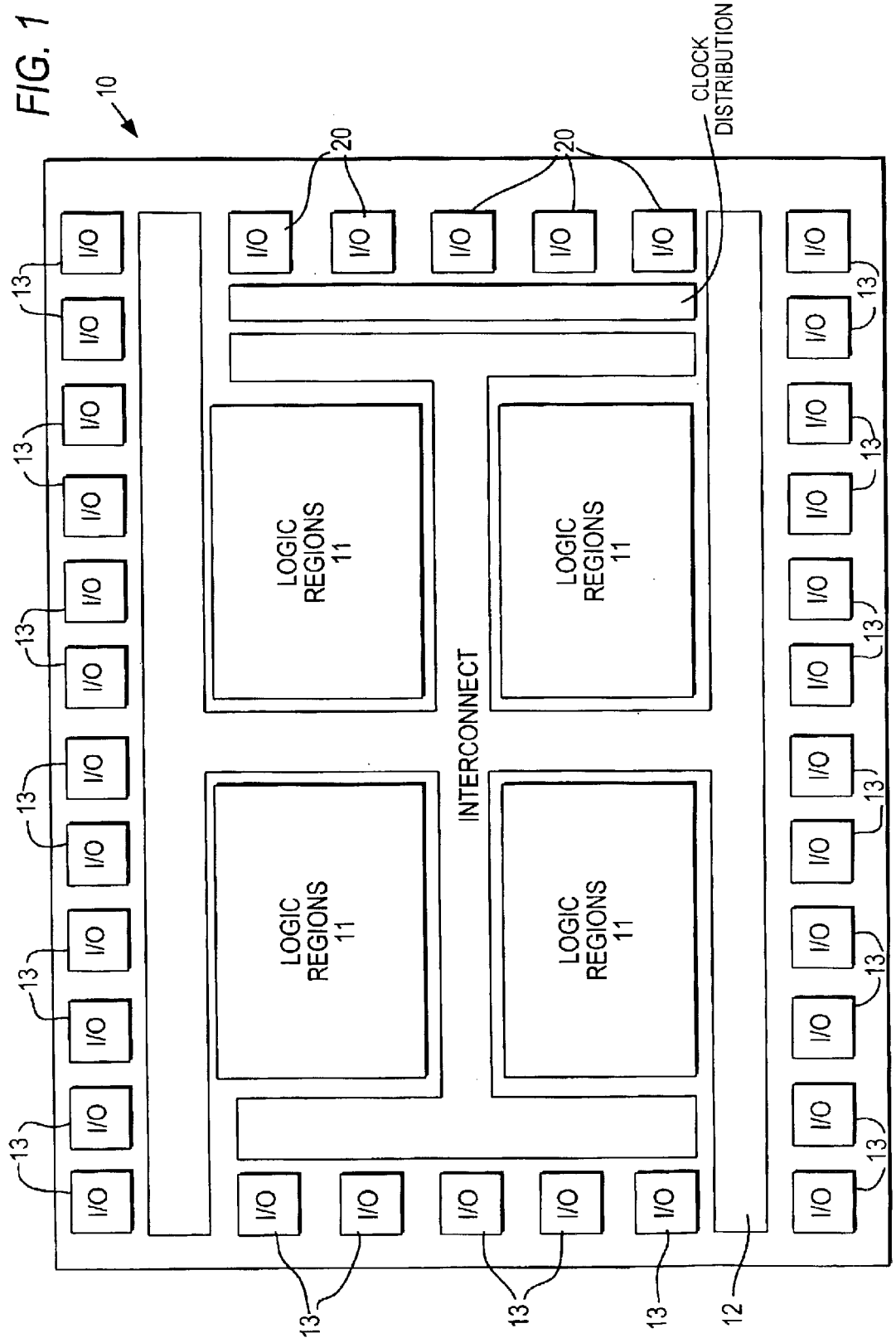
FIG. 1 is a block diagram of a preferred embodiment of a programmable logic device incorporating the present invention.

PLD 10, shown schematically in FIG. 1, is one example of a device incorporating a serial interface 20 according to the invention, having PLLs and configured so that the PLLs may be used elsewhere in the programmable logic core— i.e., in one of programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

PLD 10 also includes a plurality of other input/output ("I/O") regions 13. I/O regions 13 preferably are programmable, allowing the selection of one of a number of possible I/O signaling schemes, which may include differential and/or non-differential signaling schemes. Alternatively, I/O regions 13 may be fixed, each allowing only a particular signaling scheme. In some embodiments, a number of different types of fixed I/O regions 13 may be provided, so that while an individual region 13 does not allow a selection of signaling schemes, nevertheless PLD 10 as a whole does allow such a selection.

Figure 2:
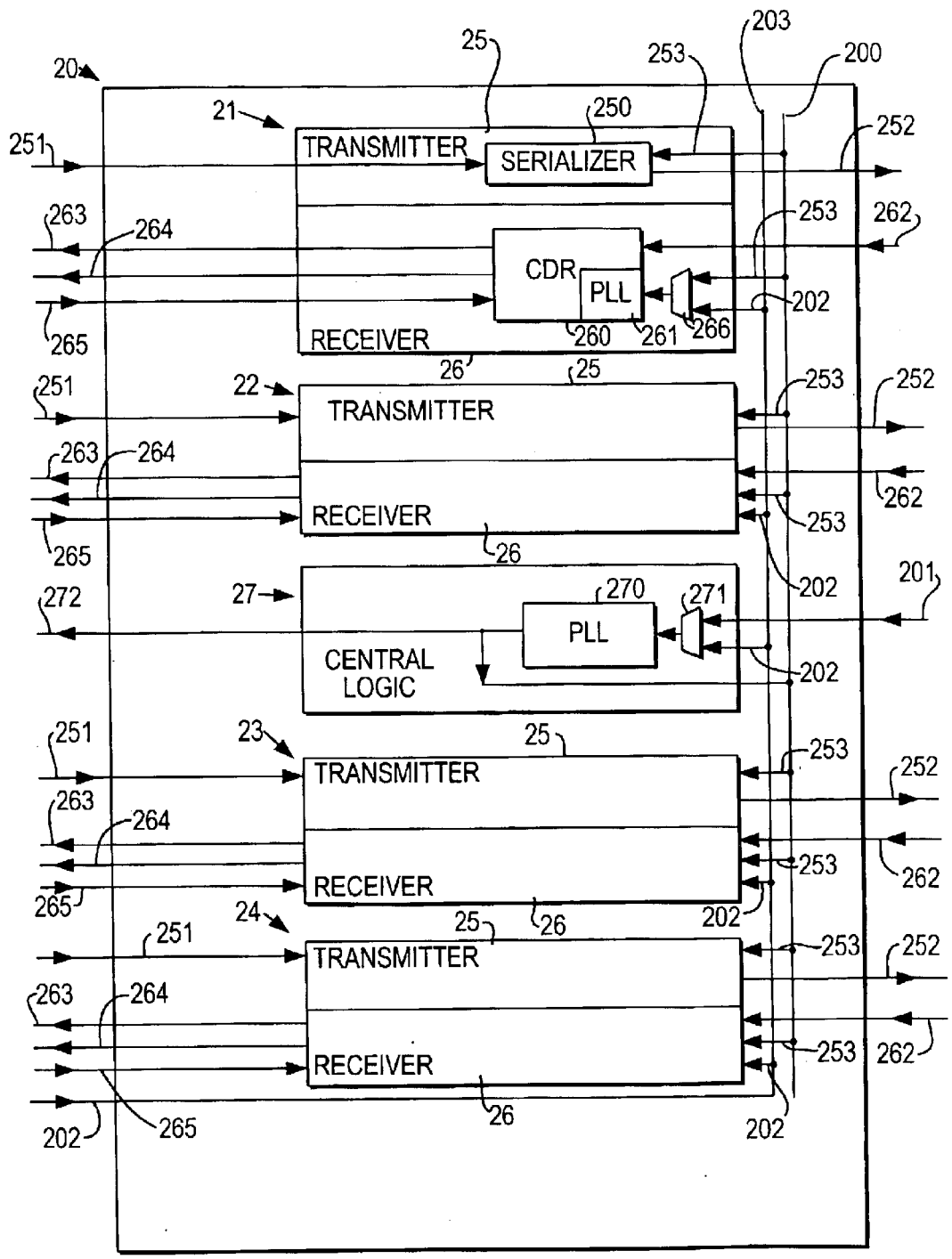
FIG. 2 is a schematic diagram of a preferred embodiment of a serial interface according to the present invention.
Figure 4:
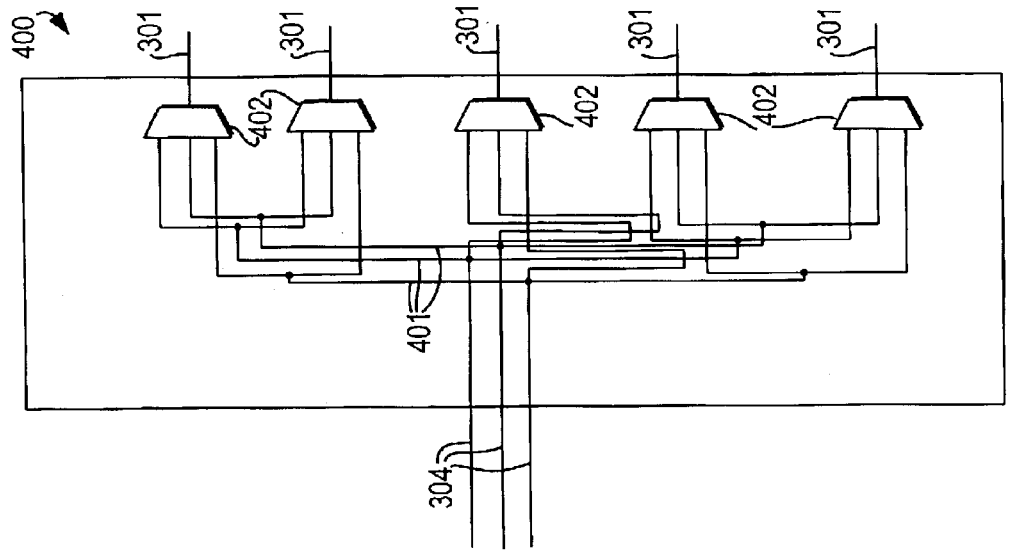
FIG. 4 is a schematic diagram of a second preferred embodiment of a reference clock network according to the present invention.

For example, each I/O region 20 preferably is a high-speed serial interface as described above, similar to an interface capable of implementing the XAUI standard. Thus, as shown in FIG. 2, each interface 20 preferably includes four channels 21–24, each including a transmitter 25 and a receiver 26, as well as central logic 27. As discussed above, because each such interface includes four channels, it may be referred to as a "quad." However, it should be understood that in accordance with the present invention, which is not linked to any particular high-speed serial standard, each interface 20 can include any number of channels.

As shown in FIG. 1, PLD 10 includes five interfaces 20, for a total of twenty channels. However, PLD 10 may include any desired number of interfaces 20, with a corresponding number of channels.

Within each interface 20, all transmitters 25 preferably are identical, and all receivers 26 preferably are identical, and preferably are substantially similar to known high-speed serial interface transmitters and receivers such as those used with the XAUI standard. The details of transmitter 25 and receiver 26 are shown in FIG. 2 only for the transmitter and receiver of channel 21, but all channels preferably are identical. Most of the details shown in receiver 26 are those that differ from the standard in accordance with the present invention, while the details shown in transmitter 26 are simply to facilitate discussion. It should be noted that any differences between transmitter 25 or receiver 26 and known high-speed serial transmitters and receivers preferably maintain compatibility with existing standards such as the XAUI standard, while adding capabilities as described herein.

Transmitter 25 of each channel 21–24 preferably includes a serializer 250 that converts parallel data 251 from the PLD core into serial output data 252. Serializer 250 preferably is clocked by a reference clock signal 253 generated by PLL 270 of central logic 27 and distributed to preferably all channels on conductor 200. PLL 270 preferably may be provided with a reference clock 201 from outside PLD 10, or, in accordance with the present invention, from a reference clock signal 202 from the PLD core, distributed to all channels 21–24 on conductor 203. A multiplexer 271 preferably is provided in accordance with this invention to select between outside reference clock 201 or core reference clock 202. As shown in FIG. 2, reference clock signal 202 is introduced at one end of conductor 203. Although the distances between channels are small, if minimizing skew of signal 202 among channels 21–24 is important, signal 202 may be introduced (not shown) closer to the middle of conductor 203, near central logic 27.

Receiver 26 preferably includes a CDR module 260 which includes a PLL 261. In "normal" operation, module 260 accepts a serial input data signal 262 and outputs a parallel output data signal 263 along with a recovered clock signal 264. PLL 261 is used in the CDR process to derive those two signals 263, 264 from input data signal 262. In that process, PLL 261 locks to input data signal 262 and needs no other inputs.

In accordance with the present invention, if a particular channel (e.g., channel 21) is not being used, then PLL 261 of receiver 26 of that channel is available for use by the PLD core. To facilitate the use of PLL 261, in accordance with the present invention there preferably are provided a phase control input 265 from the PLD core for adjusting the phase of PLL 261, and a multiplexer 266 for selecting, as a reference clock for PLL 261, either core reference clock 202 or reference clock 253 generated by central logic PLL 270.

Normally in a high-speed serial interface such as that operating under the XAUI standard, PLL 261 locks only to the input data, so no phase control is necessary. However, if PLL 261 is to be used as a general purpose PLL in accordance with the invention, then phase control input 265 allows the PLD core to control the phase of PLL 261. The manner in which phase control signal 265 is generated and used is well known in the art.

Similarly, because PLL 261 normally locks to the data signal, a reference clock may not normally be used. However, if PLL 261 is to be used as a general purpose PLL in accordance with the invention, then multiplexer 266 allows the selection, under user control, of either the core-generated reference clock 202 or the central logic-generated reference clock 253.

In accordance with the present invention, output conductor 272 is also provided so that the output of central logic PLL 270 can be used by the PLD core logic.

If an entire interface, or "quad," 20 is not being used in a particular user logic design of the PLD, then five PLLs are available in accordance with the present invention for general purpose use by the PLD core. If any one or more channels of an interface 20 are being used in a user design, then the PLLs of those channels are not available for general purpose use, but the PLLs of the remaining channel or channels are available. Moreover, if any channel is in use for transmitting, then PLL 270 of central logic 27 also will be in use (at least to provide a reference clock for the transmitter 25 of any channel in use for transmitting) and will not be available for general purpose use. Therefore, if n channels (n>0) of interface 20 are in use, 4-n PLLs are available in interface 20 for general purpose use, unless all channels in use are for receiving only, in which case 5-n PLLs are available for general purpose use.

It may be that of the plurality of interfaces 20 on PLD 10, more than one interface 20 is wholly or partly unused in a particular user logic design, so that PLLs from more than one interface 20 are available for general purpose use. In some such user designs, it may be desirable for multiple ones of those PLLs to use a common reference clock, even though they are in different ones of interfaces 20. While conductors from the general interconnect 12 of PLD 10 may be used for this purpose, those conductors may not be available, or it may be necessary to use a global conductor from interconnect 12 to reach all necessary interfaces 20, which may not be a desirable use of a global conductor. Therefore, in accordance with the present invention, clock distribution network 100 is provided to distribute reference clock signals generated in the PLD core to conductors 203 in the various interfaces 20.

Figure 3:
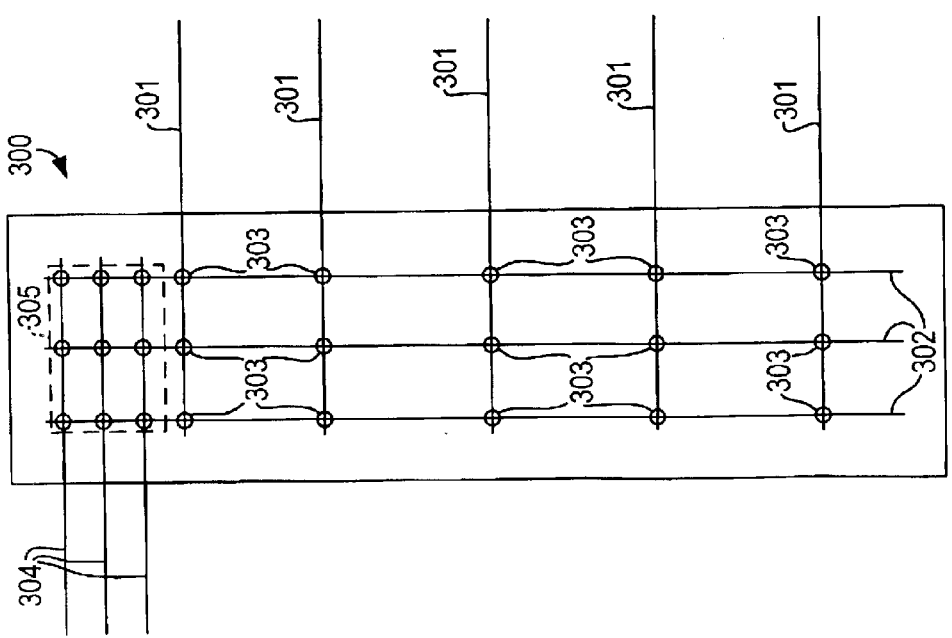
FIG. 3 is a schematic diagram of a first preferred embodiment of a reference clock network according to the present invention.

One preferred embodiment 300 of a clock distribution network 100 that may be used in accordance with the present invention is shown in FIG. 3. Network 300 is similar to a traditional fully populated PLD switch matrix. Each respective horizontal conductor 301 connects to a respective conductor 203 in one of interfaces 20. At a minimum, there is one vertical conductor 302, having a programmable connection 303 to preferably each one of conductors 301, although three conductors 302 are shown. The actual number of conductors 302 is determined by the number of different core reference clock signals that a user is to be given the capability to use in different ones of interfaces 20. The core-generated reference clock signals preferably are conducted to distribution network 300 on conductors 304. As shown, the number of conductors 304 is equal to the number of conductors 302, but that is not necessary. A fully populated switch matrix 305 is shown connecting conductors 304 to conductors 302. This arrangement allows a reference clock signal on any one of conductors 304 to be connected to any one of conductors 302, which in turn can be connected to any one of conductors 301 so that a user can share the same reference clock signal across any desired combination of interfaces 20.

It may not be necessary for distribution network 300 to be a fully populated switch matrix. In particular, it may not be necessary for each conductor 304 to be able to connect to each conductor 302. Indeed, where the number of conductors 304 is equal to the number of conductors 302, it might be preferable (not shown) simply to connect each one of conductors 304 directly to one of conductors 302. It may also not be necessary to be able to connect each conductor 301 to each conductor 302, but if those connections are not fully populated, it is more important to have a choice of programmable connections in switch matrix 305 between conductors 304 and conductors 302.

Although conductors 304 are shown being connected to conductors 302 at one end of conductors 302, it may be desirable, if minimizing skew is a concern, to connect conductors 304 to conductors 302 closer (not shown) to the midpoints of conductors 302.

If reducing skew in clock distribution network 100 is of more concern, then second preferred embodiment 400 (FIG. 4) of network 100 may be preferable. In embodiment 400, each conductor 304 is connected a balanced clock tree 401 for distribution to conductors 301. The use of multiplexers 402 provides similar flexibility to that provided by programmable connections 303 in connecting different reference clock signals on different conductors 304 to different ones of interfaces 20.

On the output side, the output of each PLL 261 is available on conductor 264 in place of the recovered clock signal provided when a respective receiver 25 is in CDR mode, while the output of PLL 270 is available on conductor 272 as described above. Each of these conductors may be connected to the general interconnect 12 of PLD 10, or to a balanced clock tree (not shown) of the type described in connection with FIG. 4, as is well known, for distribution throughout PLD 10.

Figure 5:
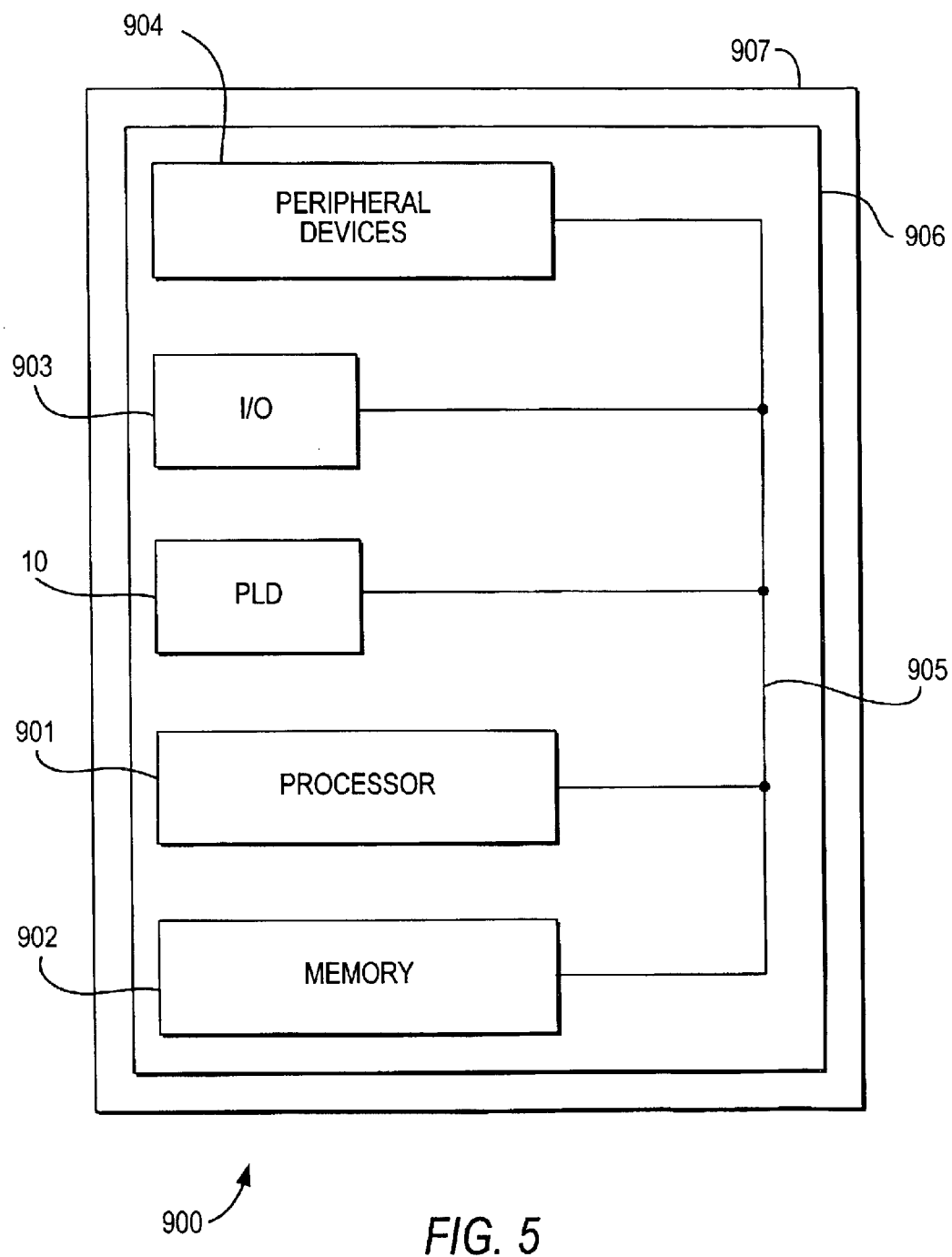
FIG. 5 is a simplified block diagram of an illustrative system employing a programmable logic device incorporating a serial interface in accordance with the present invention.

A PLD 10 incorporating interfaces 20 according to the present invention may be used in many kinds of electronic devices. One possible use is in a data processing system 900 shown in FIG. 5. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 901. PLD 10 may also be used as an arbiter for arbitrating access to a shared resources in system 900. In yet another example, PLD 10 can be configured as an interface between processor 901 and one of the other components in system 900. It should be noted that system 900 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A serial interface for use in a programmable logic device, said serial interface including at least one phase-locked loop circuit for use in processing serial data, said serial interface further comprising:

a respective first connection for accepting from elsewhere in said programmable logic device a phase control signal for input into a respective one of said at least one phase-locked loop circuit; and a respective second connection for accepting from at least one of (a) elsewhere in said programmable logic device, and (b) outside said programmable logic device, a reference clock for input into said a respective one of said at least one phase-locked loop circuit.

2. The serial interface of claim 1 wherein said at least one phase-locked loop circuit comprises a plurality of phase-locked loop circuits.

3. The serial interface of claim 2 further comprising:

a plurality of channels each having transmitter and a receiver; wherein:

each of said receivers comprises one of said plurality of phase-locked loop circuits.

4. The serial interface of claim 3 further comprising a central logic unit; wherein:

said central logic unit comprises one of said plurality of phase-locked loop circuits.

5. The serial interface of claim 4 further comprising:

a respective output connection from each of said plurality of phase-locked loop circuits for directing output of said phase-locked loop circuits elsewhere in said programmable logic device.

6. The serial interface of claim 1 further comprising:

a respective output connection from at least one of said at least one phase-locked loop circuit for directing output of said at least one of said at least one phase-locked loop circuit elsewhere in said programmable logic device.

7. The serial interface of claim 1 further comprising:

a programmable input interconnect structure for selecting an input reference clock from one of (a) an external source, and (b) said second connection.

8. The serial interface of claim 7 wherein:

said external source comprises said serial data.

9. A programmable logic device comprising the serial interface of claim 1.

10. A digital processing system comprising:

processing circuitry;

a memory coupled to said processing circuitry; and a programmable logic device as defined in claim 9 coupled to the processing circuitry and the memory.

11. A printed circuit board on which is mounted a programmable logic device as defined in claim 9.

12. The printed circuit board defined in claim 11 further comprising:

memory circuitry mounted on the printed circuit board and coupled to the programmable logic device.

13. The printed circuit board defined in claim 12 further comprising:

processing circuitry mounted on the printed circuit board and coupled to the memory circuitry.

14. An integrated circuit device comprising the serial interface of claim 1.

15. A digital processing system comprising:

processing circuitry;

a memory coupled to said processing circuitry; and an integrated circuit device as defined in claim 14 coupled to the processing circuitry and the memory.

16. A printed circuit board on which is mounted an integrated circuit device as defined in claim 14.

17. The printed circuit board defined in claim 16 further comprising:

memory circuitry mounted on the printed circuit board and coupled to the integrated circuit device.

18. The printed circuit board defined in claim 17 further comprising:

processing circuitry mounted on the printed circuit board and coupled to the memory circuitry.

19. A programmable logic device comprising:

a programmable logic core; and at least one serial interface, said serial interface comprising:

at least one phase-locked loop circuit for use in processing serial data;

a first connection for accepting from said programmable logic core a phase control signal for input into at least one of said at least one phase-locked loop circuit; and a second connection for accepting from at least one of (a) said programmable logic core, and (b) outside said programmable logic device, a reference clock for input into said at least one of said at least one phase-locked loop circuit.

20. The programmable logic device of claim 19 wherein said at least one phase-locked loop circuit comprises a plurality of phase-locked loop circuits.

21. The programmable logic device of claim 20 wherein said serial interface further comprises:

a plurality of channels each having transmitter and a receiver; wherein:

each of said receivers comprises one of said plurality of phase-locked loop circuits.

22. The programmable logic device of claim 21 wherein said serial interface further comprises a central logic unit; wherein:

said central logic unit comprises one of said plurality of phase-locked loop circuits.

23. The programmable logic device of claim 22 further comprising:

a respective output connection from each of said plurality of phase-locked loop circuits for directing output of said phase-locked loop circuits to said programmable logic core.

24. The programmable logic device of claim 19 further comprising:
a respective output connection from at least one of said at least one phase-locked loop circuit for directing output of said at least one of said at least one phase-locked loop circuit to said programmable logic core.

25. The programmable logic device of claim 19 further comprising:
a programmable input interconnect structure for selecting an input reference clock from one of (a) an external source, and (b) said second connection.

26. The programmable logic device of claim 25 wherein:
said external source comprises said serial data.

27. The programmable logic device of claim 19 wherein:
said at least one serial interface comprises a plurality of said serial interface; said programmable logic device further comprising:
a reference clock distribution network for distributing said reference clock from said programmable logic core to each said second connection.

28. The programmable logic device of claim 27 wherein:
said reference clock distribution network comprises a programmable connection to each said second connection.

29. The programmable logic device of claim 27 wherein said reference clock distribution network is a balanced tree configured to equalize skew of said reference clock between said programmable logic core and each said second connection.

30. A digital processing system comprising:
processing circuitry;
a memory coupled to said processing circuitry; and
a programmable logic device as defined in claim 19 coupled to the processing circuitry and the memory.

31. A printed circuit board on which is mounted a programmable logic device as defined in claim 19.

32. The printed circuit board defined in claim 31 further comprising:
memory circuitry mounted on the printed circuit board and coupled to the programmable logic device.

33. The printed circuit board defined in claim 32 further comprising:
processing circuitry mounted on the printed circuit board and coupled to the memory circuitry.

* * * * *